(12) United States Patent
Chan et al.

(10) Patent No.: US 10,909,298 B1
(45) Date of Patent: Feb. 2, 2021

(54) WELL CONTACT CELL WITH DOPED TAP REGION SEPARATED FROM ACTIVE REGION, AND METHODS TO FORM SAME

(71) Applicant: GLOBALFOUNDRIES Dresden Module One Limited Liability Company & Co. KG, Dresden (DE)

(72) Inventors: Nigel Chan, Dresden (DE); Navneet Jain, Milpitas, CA (US)

(73) Assignee: GLOBALFOUNDRIES Dresden Module One Limited Liability Company & Co. KG, Dresden (DE)

( * ) Notice: Subject to any disclaimer, the term of this patent is extended or adjusted under 35 U.S.C. 154(b) by 0 days.

(21) Appl. No.: 16/849,413

(22) Filed: Apr. 15, 2020

(51) Int. Cl.
*G06F 30/392* (2020.01)
*H01L 27/02* (2006.01)
*H01L 27/118* (2006.01)

(52) U.S. Cl.
CPC ........ *G06F 30/392* (2020.01); *H01L 27/0207* (2013.01); *H01L 2027/11831* (2013.01)

(58) Field of Classification Search
USPC ........................................................ 716/119
See application file for complete search history.

(56) References Cited

U.S. PATENT DOCUMENTS

| | | | | |
|---|---|---|---|---|
| 7,808,051 B2* | 10/2010 | Hou | .................. | H01L 27/11807 257/368 |
| 9,190,405 B2* | 11/2015 | Chen | ..................... | H01L 27/088 |
| 2003/0227061 A1* | 12/2003 | Yokogawa | .......... | H01L 29/7725 257/379 |
| 2010/0025740 A1* | 2/2010 | Lee | .................. | H01L 27/10876 257/288 |
| 2017/0104005 A1 | 4/2017 | Haufe et al. | | |
| 2018/0225406 A1* | 8/2018 | Jain | ....................... | G06F 30/394 |

* cited by examiner

*Primary Examiner* — Mohammed Alam
(74) *Attorney, Agent, or Firm* — David Cain; Hoffman Warnick LLC

(57) ABSTRACT

The disclosure provides integrated circuit (IC) layouts and methods to form the same. An IC layout may include two standard cells, with a well contact cell laterally between them. The well contact cell may include a single semiconductor region having the first doping type, an active bridge region within the single semiconductor region, extending continuously from the first active region of the first standard cell to the third active region of the second standard cell. A doped tap region within the single semiconductor region is laterally separated from the active bridge region. The doped tap region is laterally aligned with the second active region and the fourth active region.

20 Claims, 5 Drawing Sheets

US 10,909,298 B1

WELL CONTACT CELL WITH DOPED TAP REGION SEPARATED FROM ACTIVE REGION, AND METHODS TO FORM SAME

TECHNICAL FIELD

Embodiments of the disclosure relate generally to digital logic cells for integrated circuits and related methods. Various embodiments of the digital logic architecture include well contact cells in which a doped tap region is separated from an active region and two standard cells on opposite sides of the active region.

BACKGROUND

In the microelectronics industry as well as in other industries involving construction of microscopic structures, there is a continued desire to reduce the size of structural features and microelectronic devices and/or to provide a greater amount of circuitry for a given chip size. Miniaturization in general allows for increased performance (more processing per clock cycle and less heat generated) at lower power levels and lower cost. Present technology is at nanometer-level scaling of certain micro-devices such as logic gates, field effect transistors (FETs), and capacitors. Circuit chips with hundreds of millions of such devices are common.

Standard cell design is a methodology to design the layout of an integrated circuit with various predetermined digital logic features and configurations, e.g., used for automatic placement and routing. Using known configurations of transistors to implement various logic gate structures, the device layer of a product may be separated into individual cells where the transistors may be formed. During operation, the body of the transistor (or back gate in the case of SOI technologies) is electrically biased, e.g., to control the threshold voltage of particular transistors in a device. However, the addition of such electrical biasing taps may occupy space that is otherwise used for ensuring that the surface area of the transistor meets design requirements for the layout. Conventional cell layouts sometimes fail to accommodate electrical biasing taps in a way that preserves the area of a cell, particularly when multiple biasing taps are located near each other.

SUMMARY

Aspects of the disclosure provide an integrated circuit (IC) layout including: a first standard cell having a first active region of a first doping type adjacent a second active region of a second doping type; a second standard cell having a third active region of the first doping type adjacent a fourth active region of the second doping type, the second standard cell being laterally separated from the first standard cell; and a well contact cell laterally between the first standard cell and the second standard cell, the well contact cell including: a single semiconductor region having the first doping type, an active bridge region within the single semiconductor region, extending continuously from the first active region of the first standard cell to the third active region of the second standard cell, and a doped tap region within the single semiconductor region and laterally separated from the active bridge region, wherein the doped tap region is laterally aligned with the second active region and the fourth active region.

Further aspects of the disclosure provide an integrated circuit (IC) layout including: a first standard cell having a first active region of a first doping type adjacent a second active region of a second doping type; a second standard cell having a third active region of the first doping type adjacent a fourth active region of the second doping type, the second standard cell being laterally separated from the first standard cell; and a well contact cell laterally between the first standard cell and the second standard cell, the well contact cell including: an active bridge region extending continuously from the first active region of the first standard cell to the third active region of the second standard cell, and a doped tap region having the second doping type and laterally separated from the active bridge region, wherein the doped tap region is laterally aligned with the second active region and the fourth active region, and wherein the doped tap region is configured to electrically bias the active bridge region.

Still further aspects of the disclosure provide a method of forming an integrated circuit (IC) layout, the method including: providing a structure including: a first standard cell having a first active region of a first doping type adjacent a second active region of a second doping type, a second standard cell having a third active region of the first doping type adjacent a fourth active region of the second doping type, the second standard cell being laterally separated from the first standard cell, and a semiconductor region laterally between the first standard cell and the second standard cell; forming an active bridge region within the semiconductor region, such that the first active region extends continuously from the first active region to the third active region; and forming a doped tap region within the semiconductor region, such that the doped tap region is laterally between the second active region and the fourth active region, and in electrical communication with the active bridge region.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
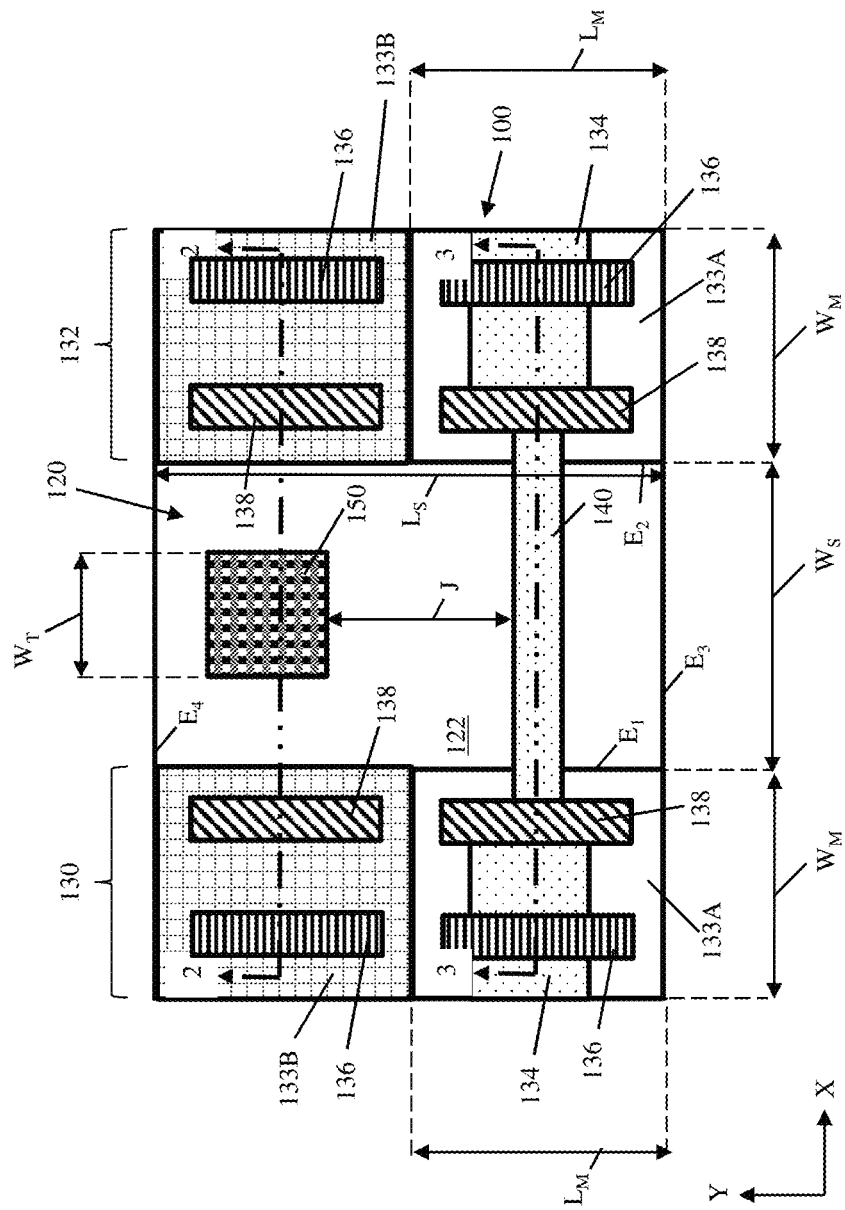
FIG. 1 depicts a portion of an IC layout according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may are no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure pertain to integrated circuits (IC) layouts including well contact cells for electrical biasing, and methods to form ICs with the well contact cells. In many devices, it may be desirable to form an electrical connection to the channel region of a transistor, e.g., to provide a back-gate voltage bias to the transistor. Such biasing of a transistor may influence the threshold voltage (i.e., the voltage magnitude needed to allow or prevent currents through the channel) of the transistor during operation. Embodiments of the disclosure provide an IC layout with a well contact cell with a doped tap region for electrically biasing a continuous active semiconductor region. Embodiments of the disclosure are operable to provide doped tap regions with operational reliability, and without significantly affecting the position and arrangement of nearby logic cells.

Embodiments of the disclosure provide an IC layout including multiple standard cells, i.e., groups of transistors having a uniform surface area and formed on a combination of p-type and n-typed semiconductor to implement various logic functions of a device. An IC layout of the disclosure may include first standard cell with a first active region of a first doping type adjacent a second active region of a second doping type. The IC layout may also include a second standard cell having a third active region of the first doping type adjacent a fourth active region of the second doping type. The second standard cell is laterally separated from the first standard cell. A well contact cell is laterally between the first standard cell and the second standard cell. The well contact cell includes a single semiconductor region having the first doping type, and an active bridge region within the single semiconductor region. The active bridge region extends continuously from the first active region of the first standard cell to the third active region of the second standard cell. A doped tap region may be within the single semiconductor region and laterally separated from the active bridge region. The doped tap region is laterally aligned with the second active region and the fourth active region.

FIG. 1 depicts an integrated circuit (IC) layout 100, representing part a device formed of various transistors and distributed across a two-dimensional area in plane X-Y. Layout 100 may alternatively be known as a "map," "design," "floor plan," or other term referring to the placement of various components (e.g., logic cells and their individual transistors) within a two dimensional area. IC layout 100 may be formed above a well 102 (FIGS. 2, 3) of semiconductor material, which may be the base material on/within which further materials (e.g., variously doped well regions, transistor structures, insulator regions, and/or other electrical components of a device) are formed. The substrate material may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity).

Various portions of layout 100 may be doped based on the intended polarity and/or function of transistors and/or other device structures formed thereon. A "dopant" refers to an element introduced into semiconductor to establish either p-type (acceptors) or n-type (donors) conductivity. Dopants are of two types: "donors" and "acceptors." N type implants are donors and P type are acceptors. In the case of a silicon substrate, common dopants may include, e.g., boron (B), and/or Iridium (In), for p-type doping. For n-type doping, the doped element(s) may include, for example, phosphorous (P) arsenic (As), and/or antimony (Sb). Doping is the process of introducing impurities (dopants) into the semiconductor substrate, or elements formed on the semiconductor substrate, and is often performed with a mask (or previously-formed, elements in place) so that only certain areas of the substrate will be doped. For example, doping is used to form the source and drain regions of a transistor. An ion implanter is typically employed for the actual implantation. An inert carrier gas such as nitrogen is usually applied to complete the dopant implantation.

Usually in doping, a dopant, a dosage and an energy level are specified and/or a resulting doping level may be specified. A dosage may be specified in the number of atoms per square centimeter ($cm^2$) and an energy level (specified in keV, kilo-electron-volts), resulting in a doping level (concentration in the substrate) of a number of atoms per cubic centimeter (cm³). The number of atoms is commonly specified in exponential notation, where a number like "3E15" means 3 times 10 to the 15th power, or a "3" followed by 15 zeroes (3,000,000,000,000,000). An example of doping is implanting with B (boron) with a dosage of between about 1E12 and 1E13 atoms/cm², and an energy of about 40 to 80 keV to produce a doping level of between 1E17 and 1E18 atoms/cm³. Doped portions of a substrate may be known in the art as a "well." A well commonly refers to the implanted/diffused region in semiconductor wafer needed to implement complementary metal oxide semiconductor (CMOS) cell. Depending on the attributes of layout 100, a well may be either n-type or p-type doped.

IC layout 100 may be subdivided into multiple areas, and multiple types of cells can be formed within the multiple areas of IC layout 100. Some cells formed in IC layout 100 may take the form of a "standard cell." A standard cell is a group of transistor and overlying interconnect structures that is known to yield a predetermined logic function. Each standard cell may include transistors and/or other structures formed on p-type doping, in addition to other transistors/structures formed on n-type doping. Each standard cell thus includes p-type and n-type semiconductor materials. Each doping type may occupy a respective half of the standard cell. A library of standard cells may include transistor cells for implementing an "and gate," an "or gate," an "exclusive or" gate, an "exclusive nor" gate, an inverter, and/or storage functions such as a latch or flip-flop. Various libraries of standard cells may include the placement of, and electrical connections to, transistors within a uniform two-dimensional surface area. A first standard cell 130 and a second standard cell 132 of IC layout 100 may be in horizontal alignment but also laterally separated from each other by a well contact cell 120.

Standard cells may be formed by the use of a CMOS transistor structure. CMOS transistors include n-channel and p-channel MOS transistors formed on the same wafer. CMOS is a popular configuration due to very low power consumption and dissipation as well as minimization of the current in "off" state. CMOS is also an effective device configuration for implementation of digital functions. In CMOS, each transistor may designed for current to flow within a respective channel between source and drain, and the channel itself may be created by applying adequate potential to the gate contact and inverting the semiconductor surface underneath the gate. Metal oxide semiconductor field effect transistor (MOSFET) structure may be implemented with Si and SiO2 gate oxides. In a CMOS configuration, efficient switching may be achieved for logic and memory applications. The component transistors of a CMOS transistor may be designated as a PMOSFET (p-channel, n-type Si substrate) and NMOSFET (n-channel, p-type Si substrate) transistor, which together form a basic CMOS cell.

Well contact cell 120 may be directly between first standard cell 130 and second standard cell 132 of layout 100. Other digital logic cells adjacent well contact cell 120 along the Y-axis are omitted from FIG. 1 solely for ease of illustration. The position of well contact cell 120 relative to other portions of IC layout 100 is discussed elsewhere herein relative to FIG. 6. Well contact cell 120 may include a single semiconductor region 122 formed of one or more of the example substrate materials discussed elsewhere herein regarding IC layout 100. As shown, single semiconductor region 122 may span the entire surface area of well contact cell 120, such that no other doping types are present within well contact cell 122. In this case, other materials and/or regions of well contact cell may be located within single semiconductor region 122. Single semiconductor region 122 may have a width $W_S$ on the X-axis between a first end $E_1$ and a second end $E_2$, and a length $L_S$ extending between a third end $E_3$ (alternatively identifiable as an "upper end") and a fourth end $E_4$ (alternatively identifiable as a "lower end") in a direction orthogonal to width $W_S$. As shown in an example implementation, length $L_S$ may be greater than that of width $W_S$. Such a discrepancy between the length $L_S$ and width $W_S$ may allow a doped tap cell to be horizontally displaced from its respective transistor cells along the Y-axis, as noted herein. Single semiconductor region 122 may be of a first doping type, e.g., p-type or n-type, to implement one of the complementary doping types for transistors of IC layout 100. Methods to form well contact cell 120 according to embodiments of the disclosure thus may include forming, or otherwise providing, single semiconductor region 122 including a doped semiconductor material within a cross-sectional area having width $W_S$ and length $L_S$.

IC layout 100 may include first standard cell 130 adjacent first end $E_1$ of single semiconductor region 122, and second standard cell 132 adjacent second end $E_2$ of single semiconductor region 122. First standard cell 130 and/or second standard cell 132 may have a width $W_M$ that is less than width $W_S$ of well contact cell 120. First standard cell 130 and second standard cell 132 each may include a set of transistors formed on doped semiconductor materials of complementary types to implement one or more foundational logic functions of an IC. As noted herein, first standard cell 130 and second standard cell 132 may be structured using "standard cell" semiconductor designs, and may provide logic functions such as an "AND gate," "OR gate," "NOT" gate, "EXCLUSIVE AND" or "EXCLUSIVE OR" gate, etc. Thus, first standard cell 130 and second standard cell 132 may have different arrangements of transistors, contacts, and/or other components to provide respective logic functions. First standard cell 130 and second standard cell 132 are shown with similar layouts in FIG. 1 solely for the sake of example.

To implement operational functions, standard cell(s) 130, 132 may include source, drain, and/or gate terminals that are electrically coupled to source, drain, and/or gate terminals within other logic cells. In IC layout 100, multiple cells (e.g., standard cells 130, 132) also may be interconnected to perform interrelated functions. A single transistor thus may include one or more terminals in first standard cell 130 and one or more terminals in second standard cell 132. According to an example, first standard cell 130 and second standard cell 132 each may include a first doped region 133A having a first doping type adjacent a second doped region 133B having a second doping type opposite the first doping type. According to an example, first doped region 133A may be p-type doped and second doped region 133B may be n-type doped. Regions 133A, 133B may provide the complementary doping types to enable various logic functions implemented with standard cells 130, 132. To help distinguish between doped regions of each standard cell 130, 132, doped regions 133A, 133B of second standard cell 132 may in some cases may be referred to as a "third doped region" 133A and "fourth doped region" 133B, respectively.

Each standard cell 130, 132 may include an active cell region 134 (e.g., one or more doped semiconductor materials) with a source/drain terminal 136 and a gate terminal 138 thereon. Active cell region 134 may be of the same doping type but more heavily doped than the doped region (e.g., first doped region 133A or second doped region 133B)

where it is placed. Source/drain terminal 136 may be configured to transmit or receive electrical inputs, while gate terminal 138 may be configured to control the flow of electrical signals through active cell region 134. One or more gate terminals 138 of first standard cell 130 or second standard cell 132 may be in the form of dummy gates, i.e., placeholder structures formed on logic cell(s) 130, 132 that do not perform electrical functions in the design of IC layout 100. Methods to form IC layout 100 may include, e.g., forming first standard cell 130 and second standard cell 132 at their respective locations alongside single semiconductor region 122.

To electrically connect first standard cell 130 to second standard cell 132, methods to form well contact cell 120 may include forming an active bridge region 140 within single semiconductor region 122. Active bridge region 140 may extend from first end $E_1$ of well contact cell 120 to second end $E_2$ of well contact cell 120 (i.e., the entire length of width $W_S$) along the X-axis. The material composition of active bridge region 140 may include the same semiconductor material(s) as single semiconductor region 122, but may also include various dopants in a concentration sufficient to create a particular doping type. The doping concentration and/or type of active bridge region 140 may be the same as that of active cell region(s) 134 of first standard cell 130 and/or second standard cell 132. Methods to form active bridge region 140 may include, e.g., introducing dopants into selected portions of single semiconductor region 122 (e.g., by ion implantation) to form active bridge region 140 with predetermined dimensions and/or at a predetermined location.

In conventional layouts for an IC device, one or more well taps for electrically biasing the transistor channels within logic cell(s) 130, 132 would be within the horizontal space (e.g., along X-axis) between the active material of standard cells 130, 132. In such an arrangement, the active material of one row of logic cells would be not be present in any locations where a transistor well tap is formed. By contrast, embodiments of IC layout 100 allow active bridge region 140 to be formed within well contact cell 120 without creating horizontal discontinuities within the active semiconductor material. This structural features increases device performance by reducing mechanical stress.

Methods to form well contact cell 120 may include forming a doped tap region 150 within single semiconductor region 122. Doped tap region 150 may include an area of doped semiconductor material having a doping type and/or concentration to provide an electrically conductive region within well contact cell 120. Doped tap region 150 may be formed by any currently known or later developed process of introducing dopants into a semiconductor material. Doped tap region 150 may have a width $W_T$ that is less than a width $W_S$ of well contact cell 120, and/or the width of active bridge region 140. The doping type of doped tap region 150 may be the same as active bridge region 140, or may be different form active bridge region 140. Doped tap region 150 may be located horizontally between active bridge region 140 and third end $E_3$ (or alternatively fourth end $E_4$) of well contact cell 120.

Portions of single semiconductor region 122 may separate doped tap region 150 from first standard cell 130 and second standard cell 132 in the X direction and Y direction, while also separating doped tap region 150 from active bridge region 140 in the Y direction. A separation distance J between active bridge region 140 and doped tap region 150 may be sufficient to structurally distinguish active bridge region 140 from doped tap region 150, while allowing doped tap region 150 to electrically bias the well below active bridge region 140. In an example, separation distance J may be at most approximately fifty nanometers (nm), but it is understood that larger or smaller dimensions are possible. Doped tap region 150 itself may be horizontally between, and separated from, a portions of first standard cell 130 and second standard cell 132 adjacent first end $E_1$ and/or second end $E_2$ of well contact cell 120. The portions of standard cells 130, 132 aligned with doped tap region 150 may include second doped region 133B, having an opposite doping type from single semiconductor region 122.

Figure 2:
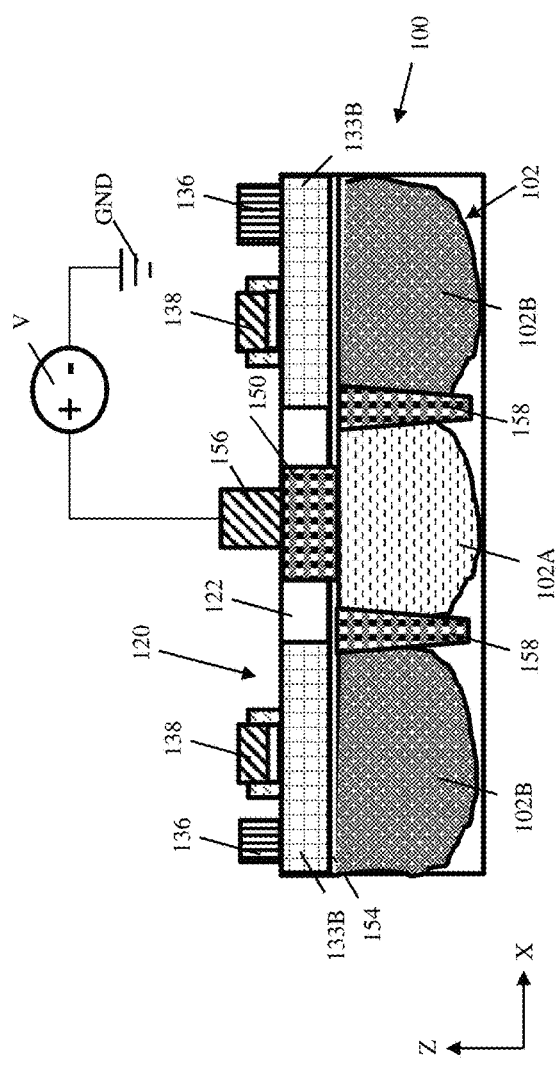
FIG. 2 depicts a cross-sectional view of the IC layout according to embodiments of the disclosure along line 2-2 of FIG. 1.
Figure 3:
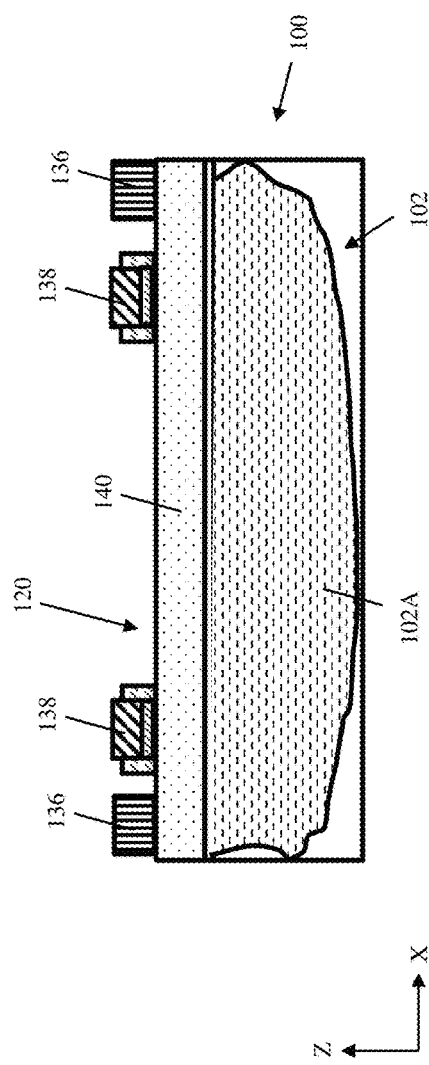
FIG. 3 depicts a cross-sectional view of the IC layout according to embodiments of the disclosure along line 3-3 of FIG. 1.

Referring now to FIGS. 1-3 together, in which FIG. 2 provides a cross-sectional view along line 2-2 of FIG. 1 and FIG. 3 provides a cross-sectional view along line 3-3 of FIG. 1, additional features of IC layout 100 are shown. In some implementations, IC layout 100 may be formed from a semiconductor on insulator (SOI), or more specifically, a fully depleted semiconductor on insulator (FDSOI) substrate configuration. In such cases, single semiconductor region 122 (FIGS. 1, 2) and corresponding portions of first standard cell 130 and second standard cell 132 may be positioned above well 102 and a buried insulator layer 154 (also known as a "buried oxide" or "BOX" layer) may vertically and electrically separate well 102 from single semiconductor region 122. Here, portions of doped tap region may be positioned alongside portions of buried insulator layer 154. To provide such a structure, portions of buried insulator layer 154 may be targeted and removed (e.g., by selective etch) and doped tap region 150 material can be formed on well 102 in place of the removed insulator. In the case of an FDSOI structure, buried insulator layer 154 may have a thickness of between, e.g., approximately five nm to approximately fifty nm. The use of FDSOI technology, where applicable, provides various advantages such as increased adjustability of electric potential within the back-gate region of a transistor.

Doped tap region 150 may be formed by first removing the buried insulator layer 154 in order to contact well 102, thereby causing doped tap region 150 to be capable of electrically biasing portions of well 102. Well 102 may include a first well 102A having a first doping type and a second well 102B having a second doping type opposite the first doping type. Well 102 may take the form of any currently known or later developed semiconductor material, which may be doped p-type (e.g., first well 102A) or n-type (e.g., second well 102B) in various embodiments of the disclosure. In this case, well 102 may be doped by any currently known or later developed process to dope a region of semiconductor material at an opposing surface, and in various implementations may electrically and physically separate adjacent transistor cells, including embodiments of well contact cell 120, from each other. Well 102 itself be positioned on an underlying region of non-doped semiconductor material(s) (not shown).

A back gate contact 156 may couple a voltage source V to doped tap region 150. In this case, back gate contact 156 will cause doped tap region 150 to operate as a back gate terminal. Methods according to the disclosure may include applying an electrical voltage to doped tap region 150. The applying of electrical voltage to doped tap region 150 can affect the electrical conductivity through active bridge region 140, e.g., by electrically biasing well 102 (e.g., within first well 102A). By electrically biasing well 102 through doped tap region 150, it is possible to adjust the conductivity across active bridge region 140 and hence the threshold voltage of gate terminal(s) 138. To prevent the applied electrical bias from affecting other portions of well 102 (e.g., second wells 102B of standard cells 130, 132), IC layout 100 may include a set of trench isolations 158 between portions of well 102. Trench isolations 158 may include any currently known or later developed dielectric material, and in some cases may include the same material or different material from that of buried insulator layer 154.

Figure 4:
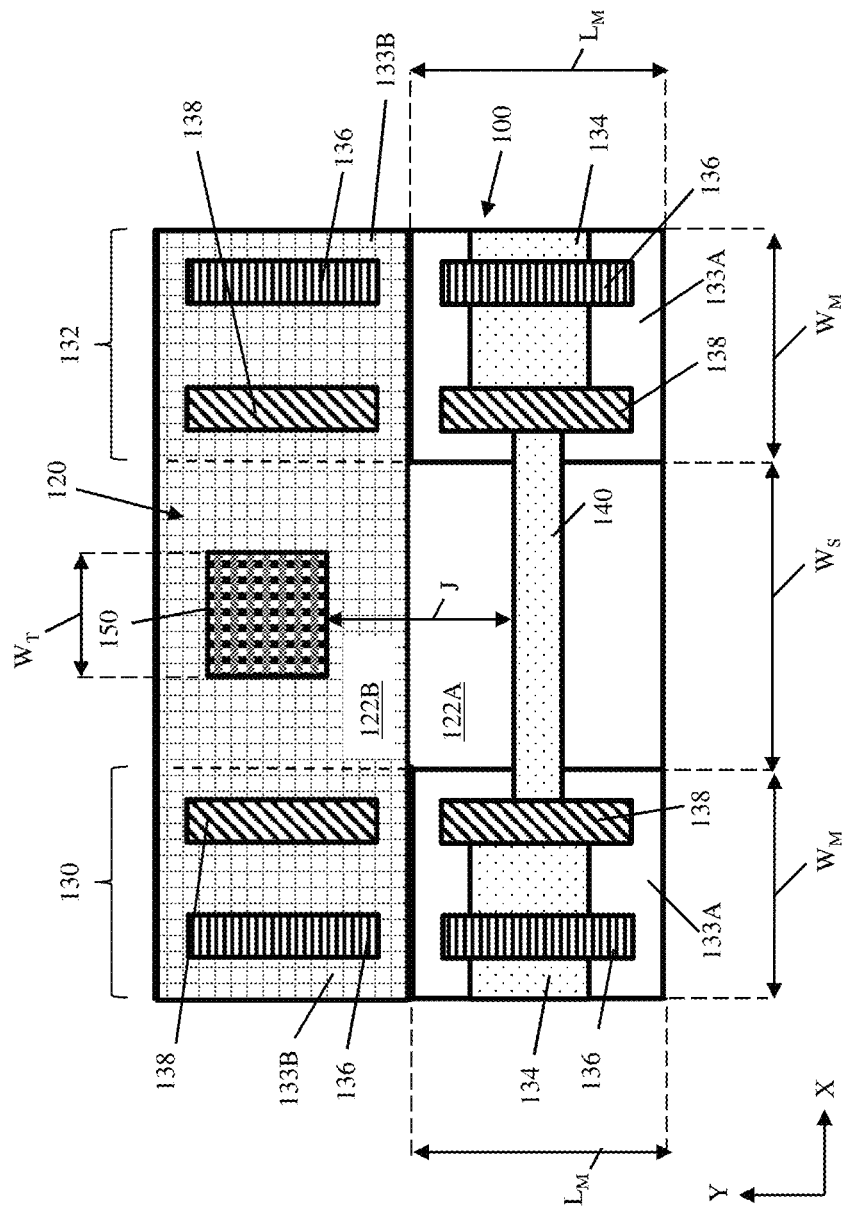
FIG. 4 depicts a portion of an IC layout according to embodiments of the disclosure.

Referring briefly to FIG. 4, embodiments of IC layout 100 may include well contact region 120 in a different configuration and/or with alternative structural features. For example, it is possible to provide well contact region 120 with multiple types of semiconductor doping, without otherwise affecting the position and function of doped tap region 150. In the FIG. 4 example, active bridge region 140 may be positioned in a first semiconductor region 122A having a first doping type (e.g., p-type). Additionally, doped tap region 150 may be positioned in a second semiconductor region 122B having a second, opposite doping type (e.g., n-type). The two semiconductor regions 122A, 122B may have the same doping types as those within adjacent standard cells 130, 132B. Thus, active bridge region 140 may be horizontally aligned (e.g., in the X-axis direction) with first doped region(s) 133A of standard cells 130, 132. Doped tap region 150 may be horizontally aligned (e.g., in the X-axis direction) with second doped region(s) 133B of standard cells 130, 132. Active bridge region 140 may remain capable of being biased through doped tap region 150, e.g., by the presence of well 102 (FIGS. 3, 4) thereunder.

Figure 5:
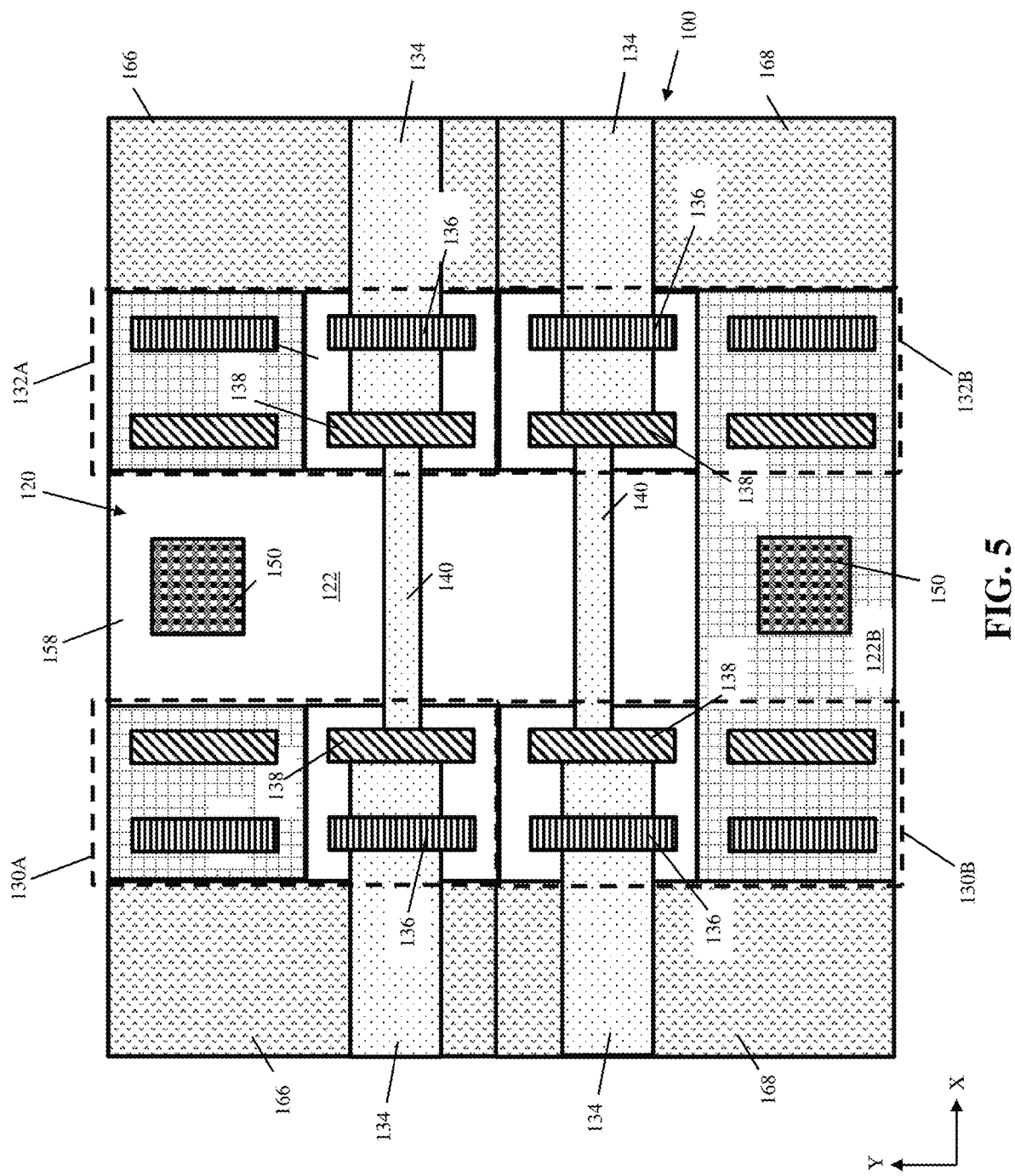
FIG. 5 depicts multiple well contact cells in an IC layout according to embodiments of the disclosure.

Turning to FIG. 5, further embodiments of IC layout 100 alternatively may include an additional active bridge region 160 within single semiconductor region 122. Additional active bridge region 160, similar to active bridge region 140, may extend from first end $E_1$ to second end $E_2$ of single semiconductor region 122. In this configuration, well contact cell 122 may be located horizontally between multiple standard cells 130, 132. Active bridge region 140 may extend from one first standard cell 130A to a corresponding second standard cell 132A. Additional active bridge region 160 may electrically couple another first standard cell 130B to another second standard cell 132B, e.g., in parallel with active bridge region 140. In the arrangement shown, active bridge region 140 may be between doped tap region 150 and additional active bridge region 160 (e.g., along the length of well contact cell 120 and/or in the direction of the Y-axis). Active bridge region 140 may be located within a first row of standard cells 166, e.g., having portions active cell region 134 that are continuous with active bridge region 140. Additional active bridge region 160 similarly may be located within a second row of standard cells 168 each having portions of active cell region 134 that are continuous with additional active bridge region 160. Each row 166, 168 of standard cells is shown with cross-hatching and without source/drain or gate contacts thereon solely for clarity of illustration.

Despite possible differences in the structure and/or operation of standard cells in each row 166, 168, doped tap region 150 forms the electrical connection to the well under one or both of active bridge regions 140, 160. Additionally or alternatively, IC layout 100 may include doped well tap 150 within doped semiconductor material having the opposite doping type from single semiconductor region 122 (identified separately as second semiconductor region 122B in FIG. 5). However embodied, doped tap region 150 can be in electrical communication with each of active bridge region 140 and additional active bridge region 160 to allow simultaneous biasing of multiple transistor cells. In further embodiments, more than two active regions may be in electrical communication with multiple doped tap regions 150. Methods to form IC layout 100 may include, e.g., forming additional active bridge layer 160 within well contact cell 120, in addition to forming additional standard cells 130A, 130B, 132A, 13B adjacent well contact cell 120 in arrangement such as the example of FIG. 5.

Figure 6:
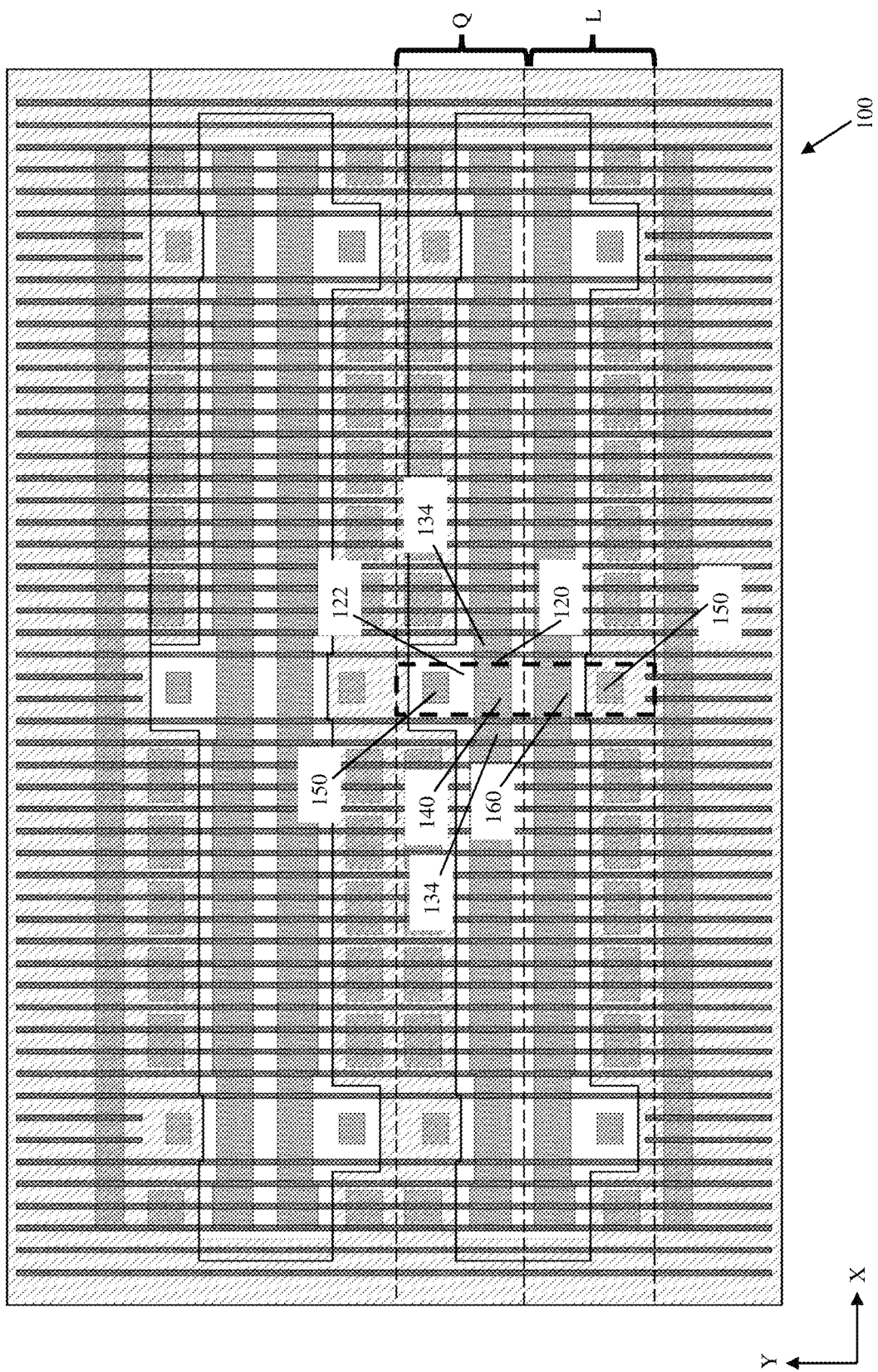
FIG. 6 depicts a plan view of a block of standard cells in an IC layout according to embodiments of the disclosure.

Referring now to FIG. 6, embodiments of IC layout 100 may include multiple well contact cells 120 at various locations where doped tap regions 150 are desired, e.g., to provide back gate or body biasing of nearby transistors. According to an example, a portion of single semiconductor region 122 (e.g., portions including active bridge layer layer 140, and where applicable second active layer 160) within each well contact cell 120 may be located within at least one first row logic cells Q. Other portions of single semiconductor region 122 (e.g., portions including doped tap region (s) 150) within each well contact cell 120 may be located within a second row of logic cells L. Thus, multiple instances of well contact cell 120 may be inserted within multiple rows Q: of logic cells without creating gaps in active material within each row Q, L. In this configuration, doped tap region 150 may remain operable to apply electrical biasing to each active region (e.g., active bridge region 140 and additional active bridge region 160). Through well contact cell(s) 120, active cell region 134 may extend continuously between opposing ends of each row Q, L, each of which may define a set or "block" of standard cells.

Embodiments of the disclosure provide several technical and commercial advantages, some of which are discussed herein as illustrative examples. Unlike conventional IC layouts, embodiments of IC layout 100 allow doped tap region(s) 150 to be formed in electrical communication with one or more active regions (e.g., active bridge region 140 and/or additional active bridge region 160) without creating discontinuities within active semiconductor material. This can provide significant benefits in the performance of the transistors in the active regions 140 and 160 as the stress due to the continuous active semiconductor material can be beneficial to carrier mobility. In some cases, e.g., as illustrated in FIG. 6, such an arrangement allows active semiconductor material of active bridge region 140 and/or additional active bridge region 160 to extend continuously across IC layout 100 without discontinuities therein. In further examples, embodiments of well contact cell 120 offer greater feature density and/or device reliability than alternative arrangements, in which contacts for back gate biasing of a transistor are formed within horizontal gaps within a row of logic cells. Such features may provide further uniformity throughout IC layout 100, and in some cases may reduce operational variability between logic cells of the same type. In some examples, embodiments of IC layout 100 with well contact cell(s) 120 therein may provide at least a six percent reduction in signal delay as compared to other IC layouts which do not include embodiments of well contact (s) 120.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated circuit (IC) layout comprising:
 a first standard cell having a first active region of a first doping type adjacent a second active region of a second doping type;
 a second standard cell having a third active region of the first doping type adjacent a fourth active region of the second doping type, the second standard cell being laterally separated from the first standard cell; and
 a well contact cell laterally between the first standard cell and the second standard cell, the well contact cell including:
  a single semiconductor region having the first doping type,
  an active bridge region within the single semiconductor region, extending continuously from the first active region of the first standard cell to the third active region of the second standard cell, and
  a doped tap region within the single semiconductor region and laterally separated from the active bridge region, wherein the doped tap region is laterally aligned with the second active region and the fourth active region.

2. The IC layout of claim 1, wherein a separation between the doped tap region and the active bridge region allows the doped tap region to electrically bias the active bridge region.

3. The IC layout of claim 1, wherein a width of the active bridge region between the first standard cell and the second standard cell is greater than a width of the first standard cell and a width of the second standard cell.

4. The IC layout of claim 1, wherein the first standard cell and the second standard cell are each included in a block of standard cells, and wherein the active bridge region is part of an active semiconductor region extending continuously between opposing ends of the block of standard cells.

5. The IC layout of claim 1, wherein the active bridge region is part of a channel region of a transistor of the first standard cell or the second standard cell, and wherein the doped tap region comprises a back-gate terminal of the transistor.

6. The IC layout of claim 1, wherein a width of the doped tap region is less than the width of the active bridge region.

7. The IC layout of claim 1, further comprising an additional active bridge region within the single semiconductor region of the well contact cell, wherein the additional active bridge region extends continuously from a third standard cell to a fourth standard cell.

8. The IC layout of claim 7, further comprising an additional doped tap region in electrical communication with the additional active bridge region, wherein the additional doped tap region is formed within an additional semiconductor region adjacent the well contact cell, and having the second doping type.

9. An integrated circuit (IC) layout comprising:
 a first standard cell having a first active region of a first doping type adjacent a second active region of a second doping type;
 a second standard cell having a third active region of the first doping type adjacent a fourth active region of the second doping type, the second standard cell being laterally separated from the first standard cell; and
 a well contact cell laterally between the first standard cell and the second standard cell, the well contact cell including:
  an active bridge region extending continuously from the first active region of the first standard cell to the third active region of the second standard cell, and
  a doped tap region having the second doping type and laterally separated from the active bridge region, wherein the doped tap region is laterally aligned with the second active region and the fourth active region, and wherein the doped tap region is configured to electrically bias the active bridge region.

10. The IC layout of claim 9, wherein the active bridge region is within a first portion of the well contact region having the first doping type, and the doped tap region is within a second portion of the well contact region having the second doping type.

11. The IC layout of claim 9, wherein a width of the active bridge region between the first standard cell and the second standard cell is greater than a width of the first standard cell and a width of the second standard cell.

12. The IC layout of claim 9, wherein the first standard cell and the second standard cell are each included in a block of standard cells, and wherein the active bridge region is part of an active semiconductor region extending continuously between opposing ends of the block of standard cells.

13. The IC layout of claim 9, wherein the active bridge region is part of a channel region of a transistor of the first standard cell or the second standard cell, and wherein the doped tap region comprises a back-gate terminal of the transistor.

14. The IC layout of claim 9, further comprising an additional active bridge region within the single semiconductor region of the well contact cell, wherein the additional active bridge region extends continuously from a third standard cell to a fourth standard cell.

15. The IC layout of claim 9, further comprising an additional doped tap region in electrical communication with the additional active bridge region, wherein the additional doped tap region is formed within an additional semiconductor region adjacent the well contact cell, and having the first doping type.

16. A method of forming an integrated circuit (IC) layout, the method comprising:
 providing a structure including:
  a first standard cell having a first active region of a first doping type adjacent a second active region of a second doping type,
  a second standard cell having a third active region of the first doping type adjacent a fourth active region of the second doping type, the second standard cell being laterally separated from the first standard cell, and
  a semiconductor region laterally between the first standard cell and the second standard cell;
 forming an active bridge region within the semiconductor region, such that the first active region extends continuously from the first active region to the third active region; and
 forming a doped tap region within the semiconductor region, such that the doped tap region is laterally between the second active region and the fourth active region, and in electrical communication with the active bridge region.

17. The method of claim 16, further comprising applying a bias voltage to the doped tap region to affect an electrical conductivity across the active bridge region between the first standard cell and the second standard cell.

18. The method of claim 16, wherein providing the structure includes forming the first standard cell and the second standard cell on a substrate, such that a width of the semiconductor region between the first standard cell and the second standard cell is greater than a width of the first standard cell and a width of the second standard cell.

19. The method of claim 16, wherein forming the first standard cell and the second standard cell includes forming a block of standard cells, and wherein forming the active bridge region also forms an active semiconductor region extending continuously between opposing ends of the block of standard cells.

20. The method of claim 16, further comprising forming a transistor within the first standard cell or the second standard cell, wherein the active bridge region is part of a channel region of the transistor, and wherein the doped tap region is a back-gate terminal of the transistor.

* * * * *